(12) United States Patent
Lee

(10) Patent No.: US 12,334,165 B2
(45) Date of Patent: Jun. 17, 2025

(54) AGING MONITORING CIRCUIT OF SEMICONDUCTOR MEMORY DEVICE

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 161 days.

(21) Appl. No.: 18/298,735

(22) Filed: Apr. 11, 2023

(65) Prior Publication Data

US 2024/0021257 A1 Jan. 18, 2024

(30) Foreign Application Priority Data

Jul. 12, 2022 (KR) .......................... 10-2022-0085353

(51) Int. Cl.
*G11C 29/50* (2006.01)
*G11C 29/02* (2006.01)

(52) U.S. Cl.
CPC .......... *G11C 29/021* (2013.01); *G11C 29/026* (2013.01)

(58) Field of Classification Search
CPC ............... G11C 29/021; G11C 29/026; G11C 2029/0409; G11C 29/50; G11C 29/50004
USPC ......................................................... 365/200
See application file for complete search history.

(56) References Cited

U.S. PATENT DOCUMENTS

2011/0181315 A1* 7/2011 Krishnan ........... G01R 31/3016
324/762.01

* cited by examiner

*Primary Examiner* — Huan Hoang
(74) *Attorney, Agent, or Firm* — KILE PARK REED & HOUTTEMAN PLLC

(57) ABSTRACT

An aging monitoring circuit of a semiconductor memory device includes a threshold voltage sensing part including an aging monitoring transistor, enabled in response to activation of an aging monitoring signal, and generating a sensing threshold signal, a level of the sensing threshold signal depending on a threshold voltage of the aging monitoring transistor, a reference threshold storage part receiving the sensing threshold signal generated in response to activation of a reference sensing signal and storing a reference threshold voltage, a level of the reference threshold voltage depending on the level of the sensing threshold signal, and a level comparing part enabled in response to the activation of the aging monitoring signal and generating an aging flag signal, a logic state of the aging flag signal depending on a comparison result between the level of the sensing threshold signal and the level of the reference threshold voltage.

9 Claims, 9 Drawing Sheets

AGING MONITORING CIRCUIT OF SEMICONDUCTOR MEMORY DEVICE

CROSS-REFERENCE TO RELATED APPLICATION(S)

This application claims priority to and benefits of Korean Patent Application No. 10-2022-0085353 under 35 U.S.C. § 119, filed on Jul. 12, 2022, in the Korean Intellectual Property Office (KIPO), the entire contents of which are incorporated herein by reference.

BACKGROUND

1. Technical Field

The disclosure relates to an aging monitoring circuit of semiconductor memory device.

2. Description of the Related Art

In general, a semiconductor memory device includes a large number of transistors. The transistor has characteristics such as negative or positive bias temperature instability, hot carrier injection, and time dependent insulation breakdown (TDDB). Therefore, the performance of the transistor ages with the cumulative usage time. A typical example of such an aging phenomenon is a change in the threshold voltage of a transistor.

Semiconductor memory devices are used in applications requiring high field reliability, such as medical devices, satellites, airplanes, and power plants. Performance aging of the semiconductor memory device may cause a life-threatening disaster.

SUMMARY

The disclosure is directed to an aging monitoring circuit of a semiconductor memory device that effectively monitors aging by changing the level of the threshold voltage of a transistor.

According to an aspect of the disclosure, there is provided an aging monitoring circuit of a semiconductor memory device.

According to an embodiment of the disclosure, the aging monitoring circuit may include a threshold voltage sensing part including an aging monitoring transistor, enabled in response to activation of an aging monitoring signal, and generating a sensing threshold signal, a level of the sensing threshold signal depending on a threshold voltage of the aging monitoring transistor, a reference threshold storage part receiving the sensing threshold signal generated in response to activation of a reference sensing signal and storing a reference threshold voltage, a level of the reference threshold voltage depending on the level of the sensing threshold signal, and a level comparing part enabled in response to the activation of the aging monitoring signal and generating an aging flag signal, a logic state of the aging flag signal depending on a comparison result between the level of the sensing threshold signal and the level of the reference threshold voltage.

According to an embodiment of the disclosure, the threshold voltage sensing part may further include a pull-up node, a pull-down node, a sensing node, a control signal generating part electrically connecting the pull-up node to a power supply voltage, electrically connecting the pull-down node to a ground voltage, and electrically connecting the sensing node to a bit line reference voltage in a normal operating period, and disconnecting electrical connection between the pull-up node and the power supply voltage, electrically connecting the pull-down node and the ground voltage, and disconnecting electrical connection between the sensing node and the bit line reference voltage in an aging monitoring period, the aging monitoring signal being inactive in the normal operating period, and active in the aging monitoring period, and at least one bit line sense amplifier, each formed in parallel between the pull-up node and the pull-down node, having the aging monitoring transistor, amplifying a voltage difference between a bit line pair using at least a part of the aging monitoring transistor in the normal operation period, and providing a voltage corresponding to the threshold voltage of the aging monitoring transistor to the sensing node in the aging monitoring period. The level of the sensing threshold signal may depend on a level of the sensing node.

According to an embodiment of the disclosure, the control signal generating part may include a pull-up supply switch electrically connecting the pull-up node to the power supply voltage in response to activation of a pull-up supply signal, the pull-up supply signal activated in the normal operating period and deactivated in the aging monitoring period, a pull-down supply switch electrically connecting the pull-down node to the ground voltage in response to activation of a pull-down supply signal, the pull-down supply signal activated in the normal operating period and the aging monitoring period, and a reference supply switch electrically connecting the sensing node to the bit line reference voltage in response to deactivation of the aging monitoring signal.

According to an embodiment of the disclosure, the control signal generating part may further include a node equalization part electrically connecting the pull-up node and the pull-down node to the bit line reference voltage in response to a standby signal activated in a standby period. The standby period may be different from the normal operating period and the aging monitoring period.

According to an embodiment of the disclosure, the bit line part may include an intrinsic bit line and a complementary bit line. The at least one bit line sense amplifier may include a pull-up driving part electrically connected to the pull-up node and increasing a voltage level of one having higher level between the intrinsic bit line and the complementary bit line in the normal operating period, a pull-down driving part decreasing a voltage level of one having lower level between the intrinsic bit line and the complementary bit line in the normal operating period and including a first pull-down transistor and a second pull-down transistor, the first pull-down transistor being an NMOS transistor formed between the pull-down node and the intrinsic bit line and having a gate node electrically connected to the complementary bit line, the second pull-down transistor being an NMOS transistor formed between the pull-down node and the complementary bit line and having a gate node electrically connected to the intrinsic bit line, and the aging monitoring transistor being one of the first pull-down transistor and the second pull-down transistor having lower threshold voltage, and a bit line equalization part electrically connecting the intrinsic bit line and the complementary bit line to the sensing node in response to activation of a bit line equalization signal.

According to an embodiment of the disclosure, the threshold voltage sensing part may further include at least one bit line sense amplifier, each amplifying a voltage of a bit line pair using the aging monitoring transistor to generate a sensing voltage. The level of the sensing threshold signal may depend on a level of the sensing voltage.

According to an embodiment of the disclosure, the reference threshold storage part may include a code converter enabled in response to the activation of the reference sensing signal and generating a threshold code, the threshold code having a value corresponding to the level of the sensing threshold signal, a code storage part storing the threshold code and generating a storage code, the storage code having a value corresponding to the threshold code, and a voltage converter generating the reference threshold voltage, the level of the reference threshold voltage corresponding to the value of the storage code.

According to an embodiment of the disclosure, the level of the reference threshold voltage may be higher than the level of the sensing threshold signal with a margin voltage difference in case that the reference sensing signal is activated.

According to an embodiment of the disclosure, the level comparing part may include a comparison part enabled in response to the activation of the aging monitoring signal and generating the aging flag signal by comparing the level of the sensing threshold signal with the level of the reference threshold voltage, the aging flag signal activated in response to the level of the sensing threshold signal being higher than the level of the reference threshold voltage, and a flag controller controlling the aging flag signal to be in an inactive state in response to inactivation of the aging monitoring signal.

According to an embodiment of the disclosure, the aging monitoring circuit of a semiconductor memory device may include a reference threshold voltage generating part including a reference monitoring transistor and generating a reference threshold voltage in response to activation of an aging monitoring signal, the reference threshold voltage dependent on a threshold voltage of the reference monitoring transistor, and the reference monitoring transistor not receiving stress upon inactivation of the aging monitoring signal, an aging threshold voltage generating part including an aging monitoring transistor and generating an aging threshold voltage in response to the activation of the aging monitoring signal, the aging threshold voltage corresponding to a threshold voltage of the aging monitoring transistor, and the aging monitoring transistor receiving stress even upon the inactivation of the aging monitoring signal, and a level comparing part enabled in response to the activation of the aging monitoring signal and generating an aging flag signal, a logic state of the aging flag signal depending on a comparison result between a level of the reference threshold voltage and a level of the aging threshold voltage.

According to an embodiment of the disclosure, the level of the reference threshold voltage may be higher than the level of the aging threshold voltage in case that stress is not applied.

According to an embodiment of the disclosure, the reference threshold voltage generating part may further include the reference monitoring transistor formed between a reference preliminary node and a ground voltage and having a gate node electrically connected to a reference control node, a buffering part buffering the aging monitoring signal to drive a reference supply node, the reference supply node controlled to a power supply voltage in response to the activation of the aging monitoring signal, and controlled to the ground voltage in response to the inactivation of the aging monitoring signal, a reference controller controlling the reference control node to the ground voltage in response to the inactivation of the aging monitoring signal, and electrically connecting the reference control node to the reference preliminary node in response to the activation of the aging monitoring signal, and a voltage dividing part dividing a voltage level between the reference supply node and the reference preliminary node to generate the reference threshold voltage.

According to an embodiment of the disclosure, the aging threshold voltage generating part may further include an aging generating node providing the aging threshold voltage, the aging monitoring transistor formed between the aging generating node and a ground voltage and having a gate node electrically connected to an aging control node, and an aging controller controlling the aging control node to a power supply voltage in response to the inactivation of the aging monitoring signal and electrically connecting the aging control node to the aging generating node in response to the activation of the aging monitoring signal.

According to an embodiment of the disclosure, the level comparing part may include a comparing part enabled in response to the activation of the aging monitoring signal and generating the aging flag signal after comparing the level of the reference threshold voltage and the level of the aging threshold voltage, the aging flag signal activated in response to the level of the aging threshold voltage being higher than the level of the reference threshold voltage, and a flag controller controlling the aging flag signal to be in an inactive state in response to the inactivation of the aging monitoring signal.

In the aging monitoring circuit of the disclosure having the above configuration, the degree of aging of frequently used transistors can be monitored through the logic state of the aging flag signal. As a result, according to the aging monitoring circuit of the disclosure, the aging of the semiconductor memory device can be effectively monitored using the change in the threshold voltage of the transistor.

BRIEF DESCRIPTION OF THE DRAWINGS

The above and other objects, features and advantages of the disclosure will become more apparent to those skilled in the art by describing embodiments with reference to the accompanying drawings, in which.

DETAILED DESCRIPTION OF THE EMBODIMENTS

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to the following embodiments.

The terminology used herein is for the purpose of describing embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings.

Figure 1:
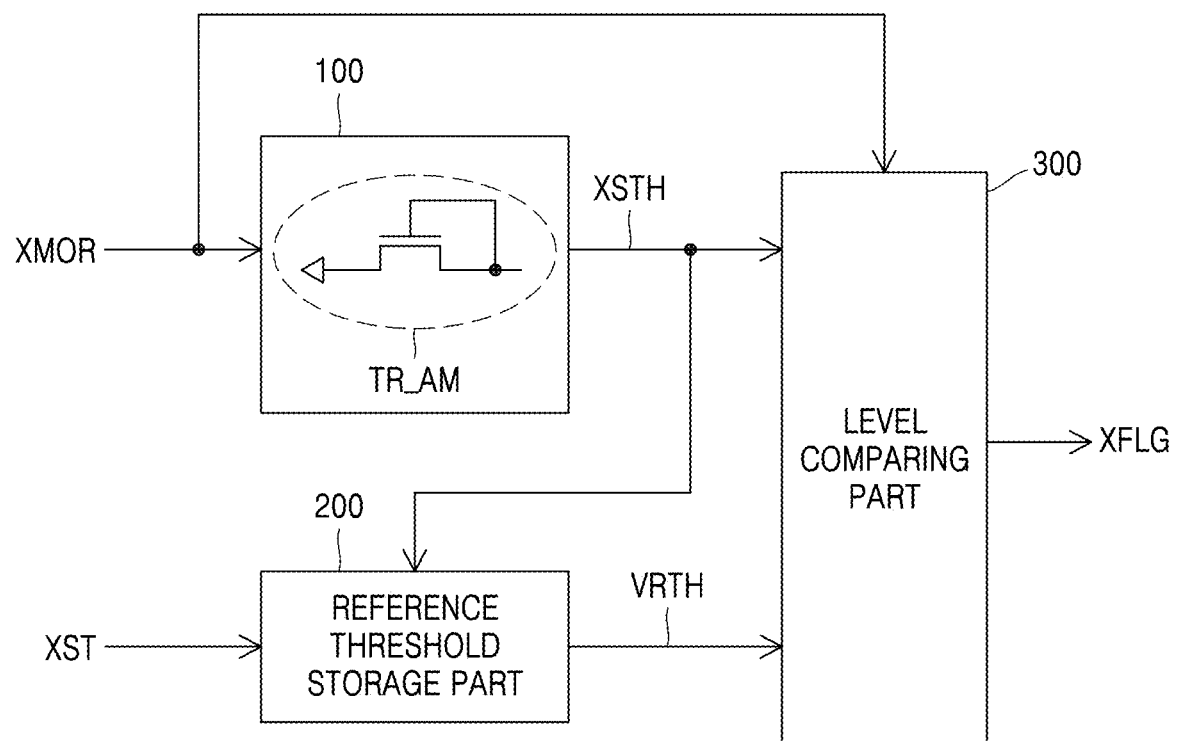
FIG. 1 is a schematic diagram showing an aging monitoring circuit of a semiconductor memory device according to an embodiment of the disclosure.

FIG. 1 is a schematic diagram showing an aging monitoring circuit of a semiconductor memory device according to an embodiment of the disclosure. Referring to FIG. 1, according to an embodiment, the aging monitoring circuit may include a threshold voltage sensing part 100, a reference threshold storage part 200 and a level comparing part 300.

The threshold voltage sensing part 100 may include an aging monitoring transistor TR_AM. The threshold voltage sensing part 100 may be enabled in response to activation of an aging monitoring signal XMOR and may generate a sensing threshold signal XSTH, which is an analog signal. The level of the sensing threshold signal XSTH, which is generated from the threshold voltage sensing part 100, may depend on the threshold voltage of the aging monitoring transistor TR_AM.

The aging monitoring signal XMOR may be inactivated to "L" in the normal operating period P_NOR and activated to "H" in the aging monitoring period P_AMN. (See FIG. 4)

Figure 2:
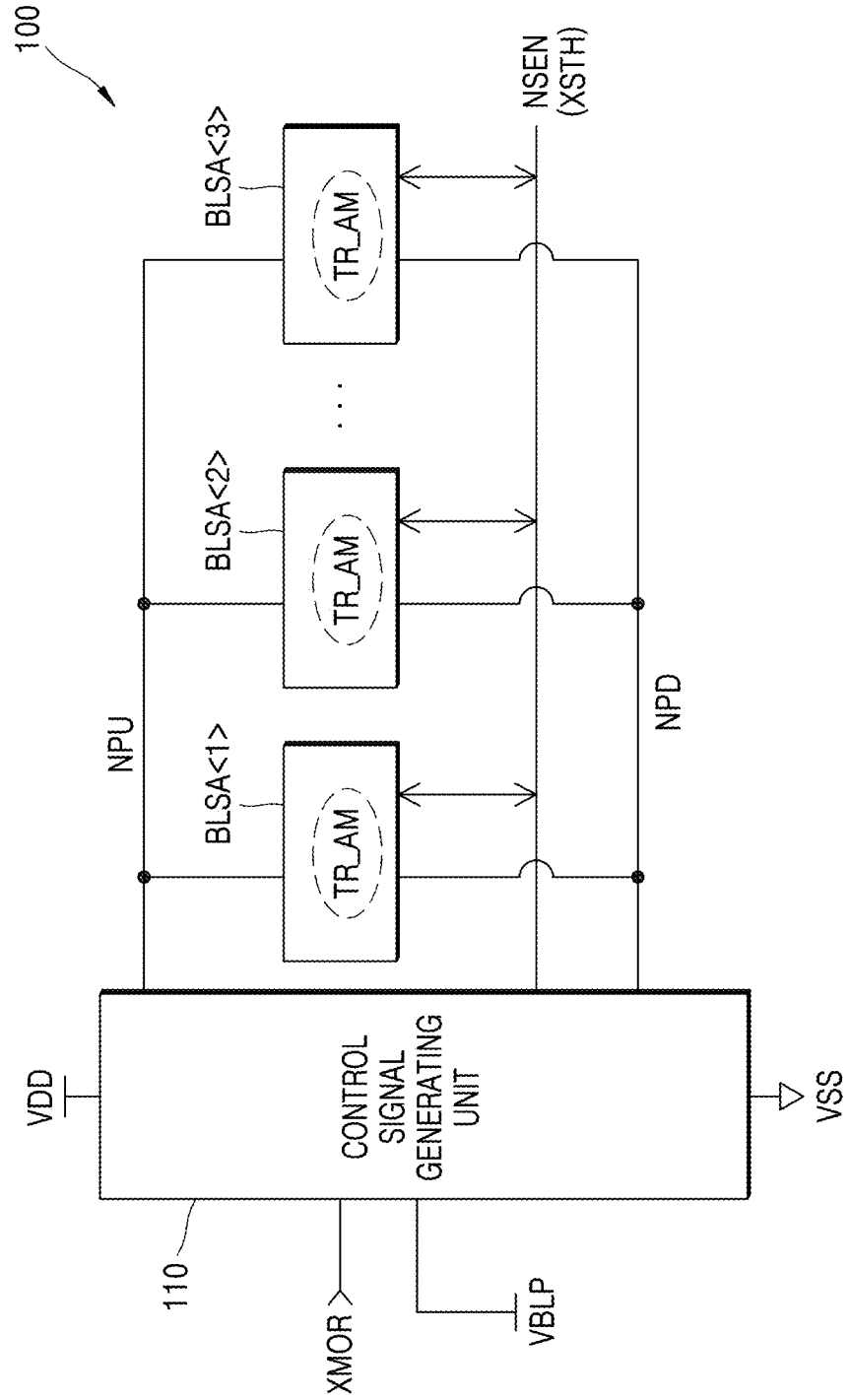
FIG. 2 is a schematic diagram showing the threshold voltage sensing part of FIG. 1.

FIG. 2 is a schematic diagram showing the threshold voltage sensing part 100 of FIG. 1. Referring to FIG. 2, the threshold voltage sensing part 100 may include a pull-up node NPU, a pull-down node NPD, a sensing node NSEN, a control signal generating part 110, and at least one bit line sense amplifier BLSA. In an embodiment, the threshold voltage sensing part 100 may include 1-st to n-th bit line sense amplifier BLSA<1:n>. 'n' may be an integer greater than or equal to 2.

In the normal operating period P_NOR, the control signal generating part 110 may electrically connect the pull-up node NPU to a power supply voltage VDD. In the normal operating period P_NOR, the pull-down node NPD may be electrically connected to a ground voltage VSS, and the sensing node NSEN may be electrically connected to a bit line reference voltage VBLP.

In the aging monitoring period P_AMN, the control signal generating part 110 may disconnect electrical connection between the pull-up node NPU and the power supply voltage VDD. In the aging monitoring period P_AMN, the pull-down node NPD may be connected to the ground voltage VSS, and the electrical connection between the sensing node NSEN and the bit line reference voltage VBLP may be disconnected.

The 1-st to the n-th bit line sense amplifier BLSA<1:n> may be formed in parallel between the pull-up node NPU and the pull-down node NPD. Each of the 1-st to the n-th bit line sense amplifier BLSA<1:n> may have the aging monitoring transistor TR_AM.

In the normal operation period P_NOR, each of the 1-st to the n-th bit line sense amplifier BLSA<1:n> may amplify a voltage difference between a bit line pair PBL of the semiconductor memory device by using at least a part of the aging monitoring transistor TR_AM.

In the aging monitoring period P_AMN, each of the 1-st to the n-th bit line sense amplifier BLSA<1:n> may provide a voltage corresponding to the threshold voltage of the aging monitoring transistor TR_AM to the sensing node NSEN.

In the aging monitoring period P_AMN, the level of the sensing threshold signal XSTH may depend on the level of the sensing node NSEN.

For example, the level of the sensing threshold signal XSTH, which is generated from the threshold voltage sensing part 100, may correspond to the average value of the threshold voltage of each of the aging monitoring transistors TR_AM.

Figure 3:
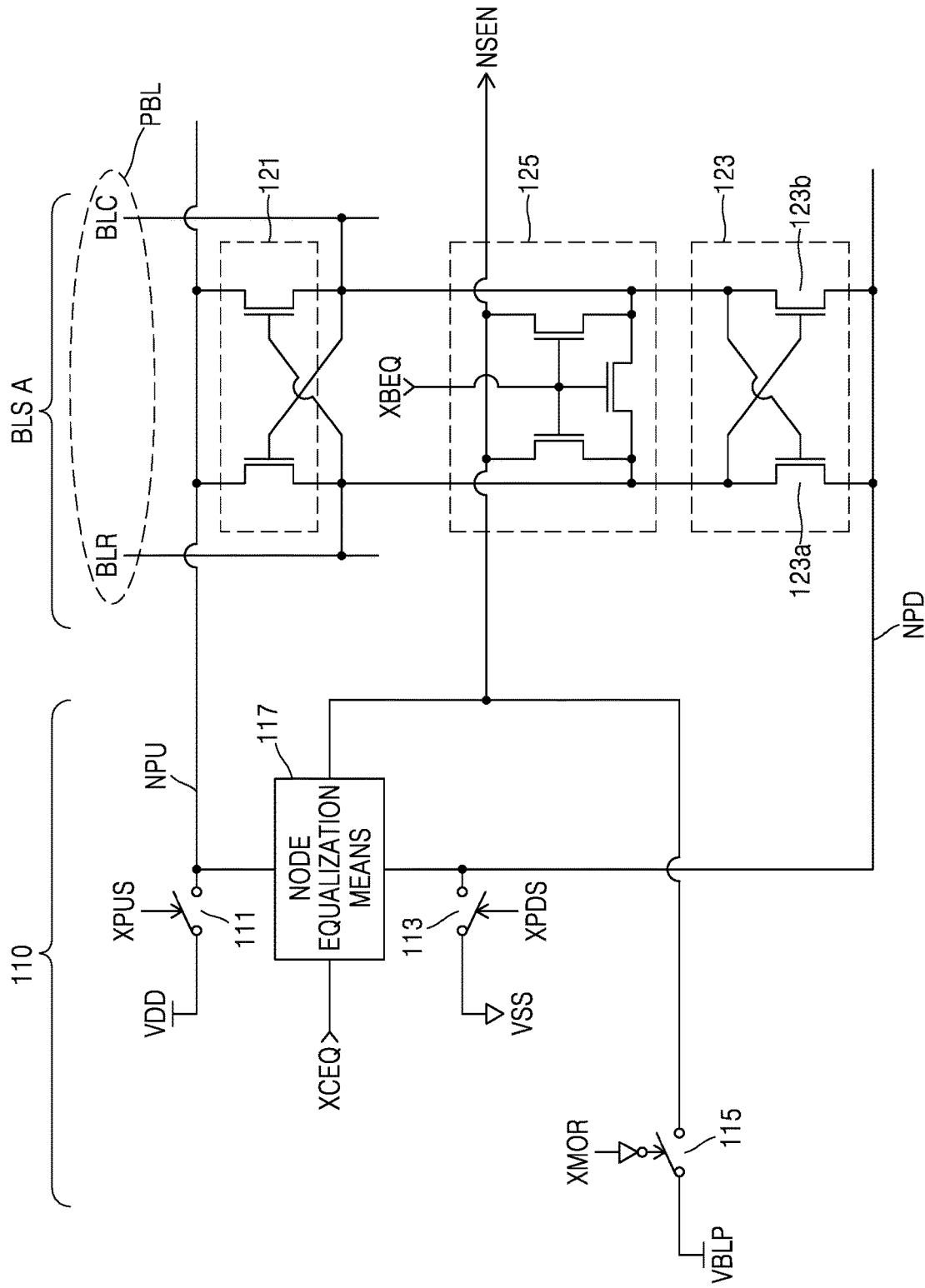
FIG. 3 is a schematic diagram showing a control signal generating part and one of the bit line sense amplifiers of FIG. 2.

FIG. 3 is a schematic diagram showing a control signal generating part 110 and one of the bit line sense amplifiers BLSA of FIG. 2.

Referring to FIG. 3, the control signal generating part 110 may include a pull-up supply switch 111, a pull-down supply switch 113, and a reference supply switch 115. In an embodiment, the control signal generating part 110 may further include a node equalization part 117.

The pull-up supply switch 111 may electrically connect the pull-up node NPU and the power supply voltage VDD in response to activation of a pull-up supply signal XPUS. The pull-up supply signal XPUS maybe activated in the normal operating period P_NOR and deactivated in the aging monitoring period P_AMN.

The pull-down supply switch 113 may electrically connect the pull-down node NPD to the ground voltage VSS in response to activation of a pull-down supply signal XPDS. The pull-down supply signal XPDS may be activated in the normal operating period P_NOR and the aging monitoring period P_AMN.

The reference supply switch 115 may electrically connect the sensing node NSEN to the bit line reference voltage VBLP in response to deactivation of the aging monitoring signal XMOR. Accordingly, in the normal operating period P_NOR, the sensing node NSEN may be controlled to the bit line reference voltage VBLP.

The node equalization part 117 may electrically connect the pull-up node NPU and the pull-down node NPD to the bit line reference voltage VBLP in response to activation of a standby signal XCEQ. The standby signal XCEQ may be activated in a standby period P_STD, and the standby period P_STD may be a period different from the normal operating period P_NOR and the aging monitoring period P_AMN.

According to an embodiment, the bit line pair PBL may include an intrinsic bit line BLR and a complementary bit line BLC. The intrinsic bit line BLR and the complementary bit line BLC may be connected to a memory cells (not shown). The memory cells may be disposed in the same or opposite direction with respect to the bit line sense amplifier BLSA according to the structure of the semiconductor memory device.

The bit line sense amplifier BLSA may include a pull-up driving part 121, a pull-down driving part 123, and a bit line equalization part 125.

The pull-up driving part 121 may be connected to the pull-up node NPU and may increase a voltage level of one having a higher level between the intrinsic bit line BLR and the complementary bit line BLC, in the normal operating period P_NOR.

The pull-down driving part 123 may decrease a voltage level of one having a lower level between the intrinsic bit line BLR and the complementary bit line BLC, in the normal operating period P_NOR. The pull-down driving part 123 may include a first pull-down transistor 123a and a second pull-down transistor 123b.

The first pull-down transistor 123a may be an NMOS transistor formed between the pull-down node NPD and the intrinsic bit line BLR. The first pull-down transistor 123a may have a gate node connected to the complementary bit line BLC.

The second pull-down transistor 123b may be an NMOS transistor formed between the pull-down node NPD and the complementary bit line BLC. The second pull-down transistor 123b may have a gate node connected to the intrinsic bit line BLR.

One of the first pull-down transistor 123a and the second pull-down transistor 123b having a low threshold voltage may correspond to the aging monitoring transistor TR_AM.

The bit line equalization part 125 may electrically connect the intrinsic bit line BLR and the complementary bit line BLC to the sensing node NSEN in response to activation of "H" of the bit line registering signal XBEQ.

The bit line sense amplifier BLSA may amplify a voltage difference between a corresponding bit line pair PBL in a normal operating period P_NOR using at least a part of the aging monitoring transistor TR_AM.

Figure 4:
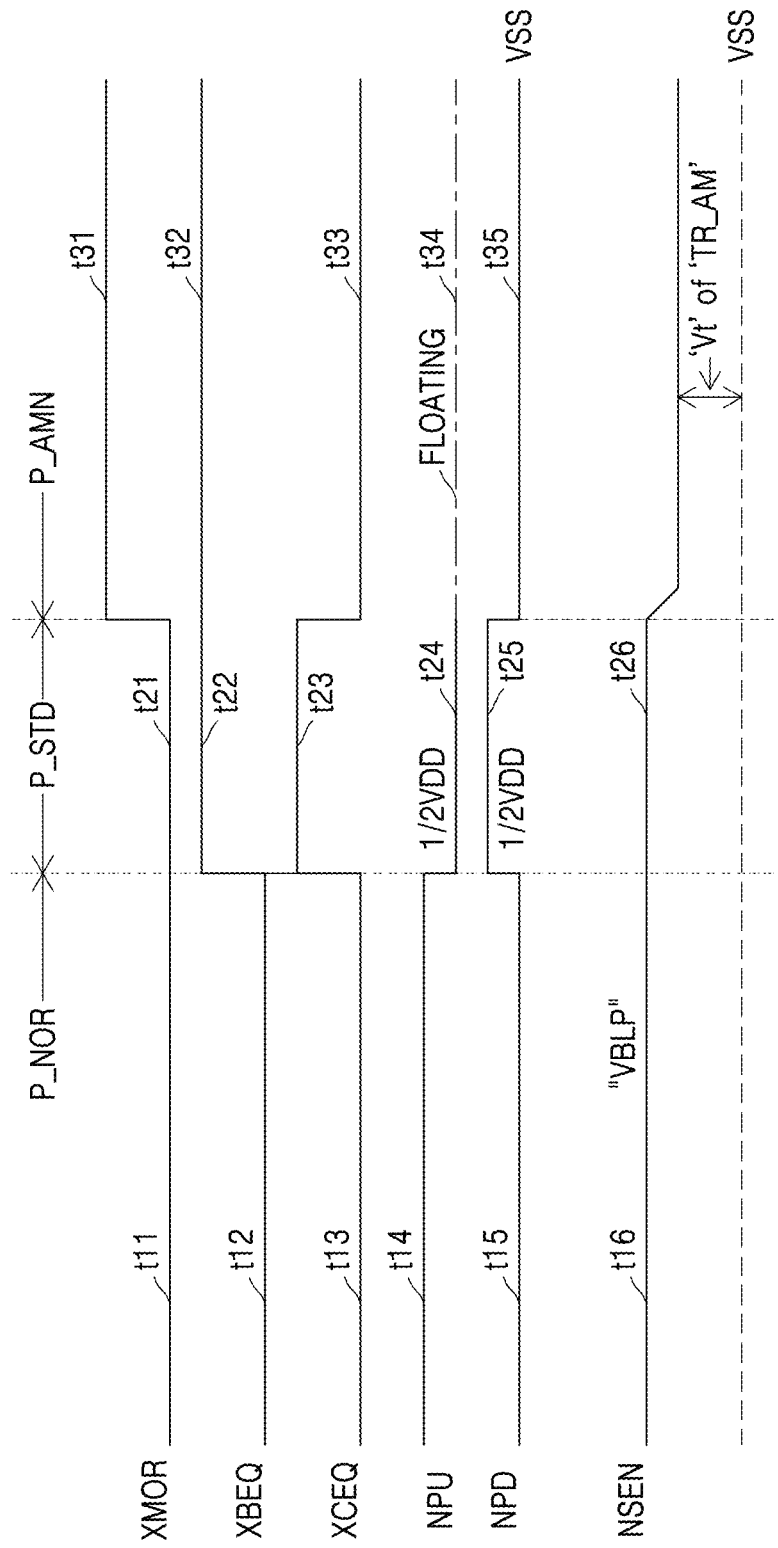
FIG. 4 is a timing diagram for explaining the operation of the control signal generating part and the bit line sense amplifier of FIG. 3.

FIG. 4 is a timing diagram for explaining the operation of the control signal generating part 110 and the bit line sense amplifier BLSA of FIG. 3.

Referring to FIG. 4, according to an embodiment, the operation of the aging monitoring circuit may include the normal operation period P_NOR, the standby period P_STD, and the aging monitoring period P_AMN.

In the normal operation period P_NOR, the aging monitoring signal XMOR may be inactivated to "L". (See t11) In the normal operation period P_NOR, the pull-up supply signal XPUS and the pull-down supply signal XPDS may be activated.

In the normal operation period P_NOR, the bit line equalization signal XBEQ and the standby signal XCEQ may be inactivated. (See t12 and t13) Accordingly, the pull-up node NPU may be controlled to the power supply voltage VDD, and the pull-down node NPD may be controlled to the ground voltage VSS. (See t14 and t15)

The sensing node NSEN may be controlled to the bit line reference voltage VBLP. (See t16)

Accordingly, the bit line sense amplifier BLSA may amplify a voltage difference between a corresponding bit line pair PBL in the normal operating period P_NOR. That is obvious to those skilled in the art. Therefore, in this specification, for simplicity of description, a detailed description thereof is omitted.

In the standby period P_STD, the aging monitoring signal XMOR may be inactivated to "L". (See t21) In the standby period P_STD, the pull-up supply signal XPUS and the pull-down supply signal XPDS may be in an inactive state. The bit line equalization signal XBEQ and the standby signal XCEQ may be activated. (See t22 and t23)

Accordingly, the pull-up node NPU and the pull-down node NPD may be controlled to half of the power supply voltage VDD. (See t24 and t25) The sensing node NSEN may be controlled to the bit line reference voltage VBLP. (See t26)

In the aging monitoring period P_AMN, the aging monitoring signal XMOR may be activated to "H". (See t31) The pull-up supply signal XPUS may be deactivated and the pull-down supply signal XPDS may be activated. The bit line equalization signal XBEQ may be in an active state, and the standby signal XCEQ may be in an inactive state. (See t32 and t33)

Accordingly, the pull-up node NPU may be in the floating state, and the pull-down node NPD may be controlled to the ground voltage VSS. (See t34 and t35)

In the aging monitoring period P_AMN, the first pull-down transistor 123a and the second pull-down transistor 123b may act as diodes.

Accordingly, the sensing node NSEN may be controlled to a smaller value between the threshold voltage of the first pull-down transistor 123a and the threshold voltage of the second pull-down transistor 123b. For example, the sensing node NSEN may be controlled to the threshold voltage of the aging monitoring transistor TR_AM.

Referring back to FIG. 1, the reference threshold storage part 200 may receive the sensing threshold signal XSTH generated in case that the reference sensing signal XST is activated. The reference threshold storage part 200 may store a reference threshold voltage VRTH.

The reference sensing signal XST may be activated at the beginning state of use of the semiconductor memory device. The beginning state of use of the semiconductor memory device may be a state in which aging of the aging monitoring transistor TR_AM is not in progress.

Figure 5:
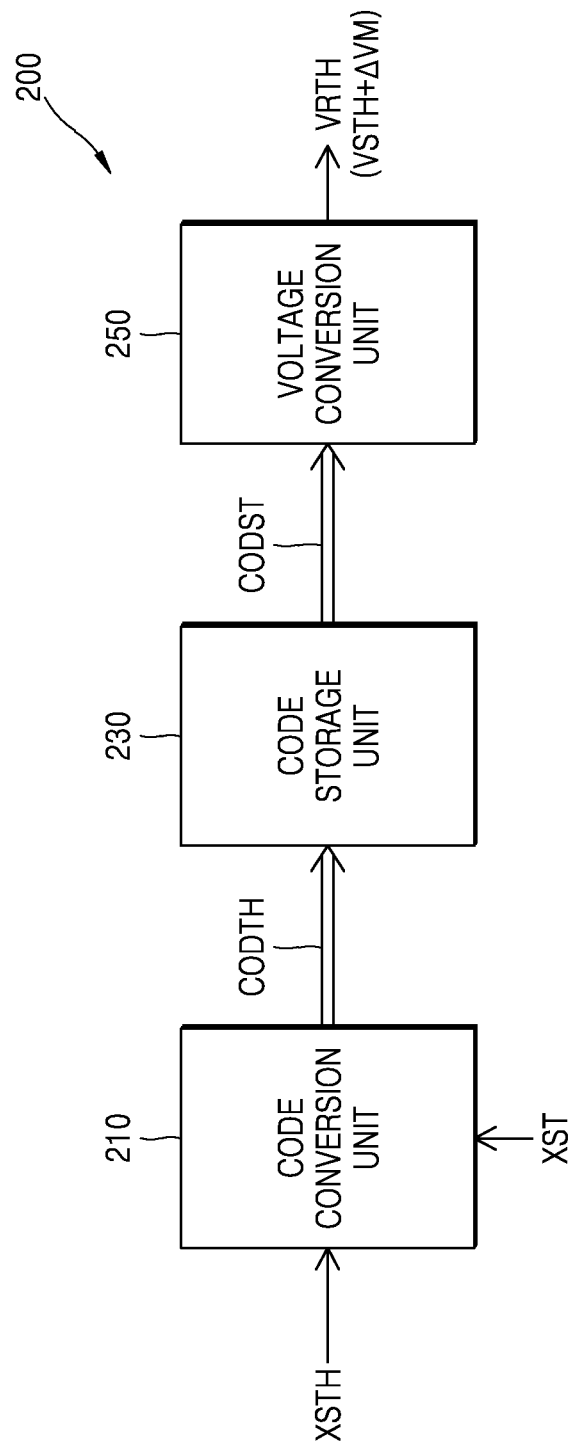
FIG. 5 is a schematic diagram showing the reference threshold storage part of FIG. 1.

FIG. 5 is a schematic diagram showing the reference threshold storage part 200 of FIG. 1. Referring to FIG. 5, the reference threshold storage part 200 may include a code converter 210, a code storage part 230, and a voltage converter 250.

The code converter 210 may be enabled in response to activation of the reference sensing signal XST. The code converter 210 may generate a threshold code CODTH. A value of the threshold code CODTH may correspond to the level of the sensing threshold signal XSTH.

The code storage part 230 may store the threshold code CODTH and may generate a storage code CODST. A value of the storage code CODST may correspond to the threshold code CODTH.

The voltage converter 250 may generate the reference threshold voltage VRTH. A level of the reference threshold voltage VRTH may correspond to the code value of the storage code CODST.

It may be desirable that the level of the reference threshold voltage VRTH is higher than the level of the sensing threshold signal XSTH with a margin voltage difference ΔVM in case that the reference sensing signal XST is activated.

According to the reference threshold storage part 200 described above, the level of the reference threshold voltage VRTH may correspond to the threshold voltage of the aging monitoring transistor TR_AM or the average value of the threshold voltages of the aging monitoring transistors TR_AM in a non-aging state.

The reference threshold storage part 200 including the code converter 210, the code storage part 230, and the voltage converter 250 may be readily implemented by those skilled in the art. Therefore, in this specification, a detailed description thereof is omitted.

Referring back to FIG. 1, the level comparing part 300 may be enabled in response to the activation of the aging monitoring signal XMOR, and may generate an aging flag signal XFLG.

Figure 6:
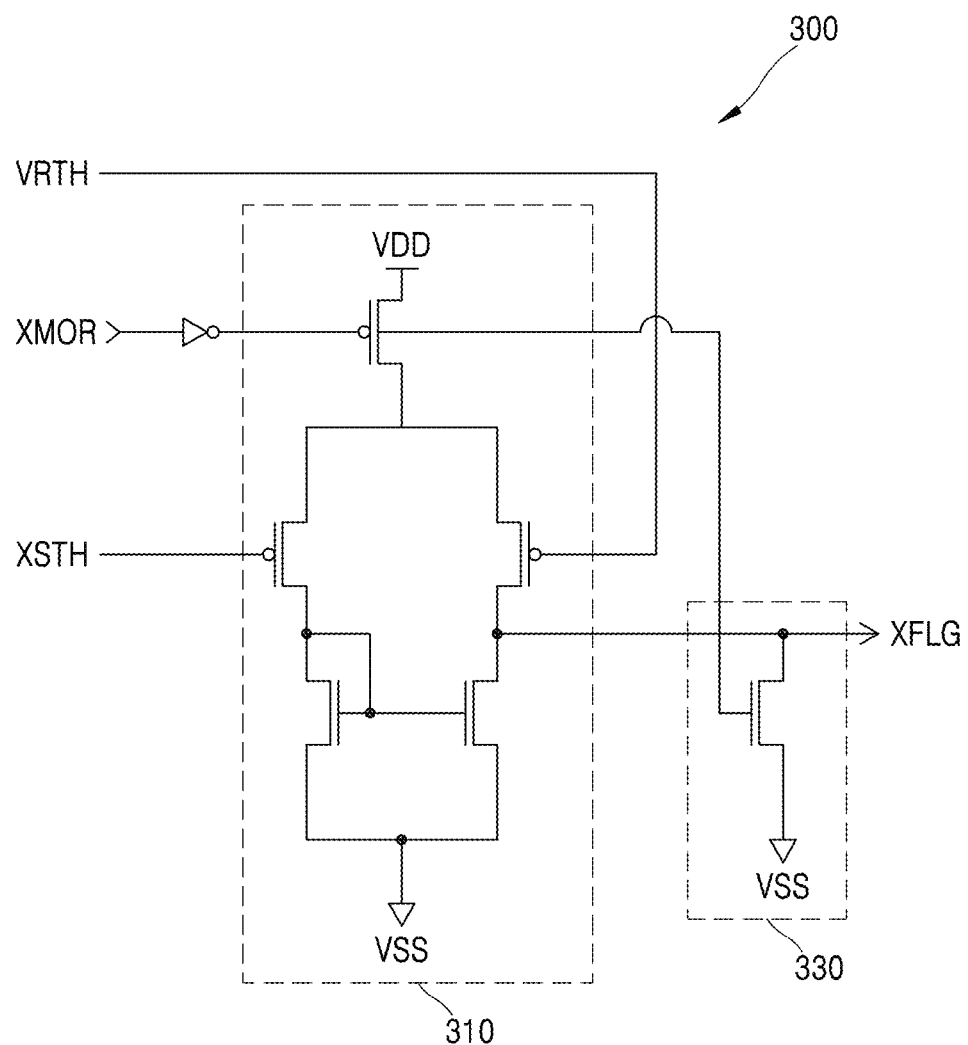
FIG. 6 is a schematic diagram showing the level comparing part of FIG. 1.

FIG. 6 is a schematic diagram showing the level comparing part 300 of FIG. 1. Referring to FIG. 6, the level comparing part 300 may include a comparison part 310 and a flag controller 330.

The comparison part 310 may be enabled in response to the activation "H" of the aging monitoring signal XMOR. The comparison part 310 may generate the aging flag signal XFLG by comparing the level of the sensing threshold signal XSTH with the level of the reference threshold voltage VRTH.

The aging flag signal XFLG may be activated to "H" in case that the level of the sensing threshold signal XSTH is higher than the level of the reference threshold voltage VRTH.

The flag controller 330 may control the aging flag signal XFLG to be in an inactive state of "L" in response to the inactivation "L" of the aging monitoring signal XMOR.

According to the level comparing part 300, the logic state of the aging flag signal XFLG may depend on the comparison result between the level of the sensing threshold signal XSTH generated from the threshold voltage sensing part 100 and the reference threshold voltage VRTH.

For example, in case that the level of the sensing threshold signal XSTH is lower than the level of the reference threshold voltage VRTH, the aging flag signal XFLG may maintain in an inactive state at "L".

In case that aging progresses and the level of the sensing threshold signal XSTH becomes higher than the level of the reference threshold voltage VRTH, the aging flag signal XFLG may be activated to "H".

For example, it may be determined by the logic state of the aging flag signal XFLG of the degree of aging of the transistor included in the bit line sense amplifier BLSA. According to an embodiment, a large number of bit line sense amplifiers BLSAs may be embedded in the semiconductor memory device employing the aging monitoring circuit.

In conclusion, according to an embodiment of the aging monitoring circuit having the above configuration, aging of the semiconductor memory device may be effectively monitored using the change in the threshold voltage of the transistor.

Figure 7:
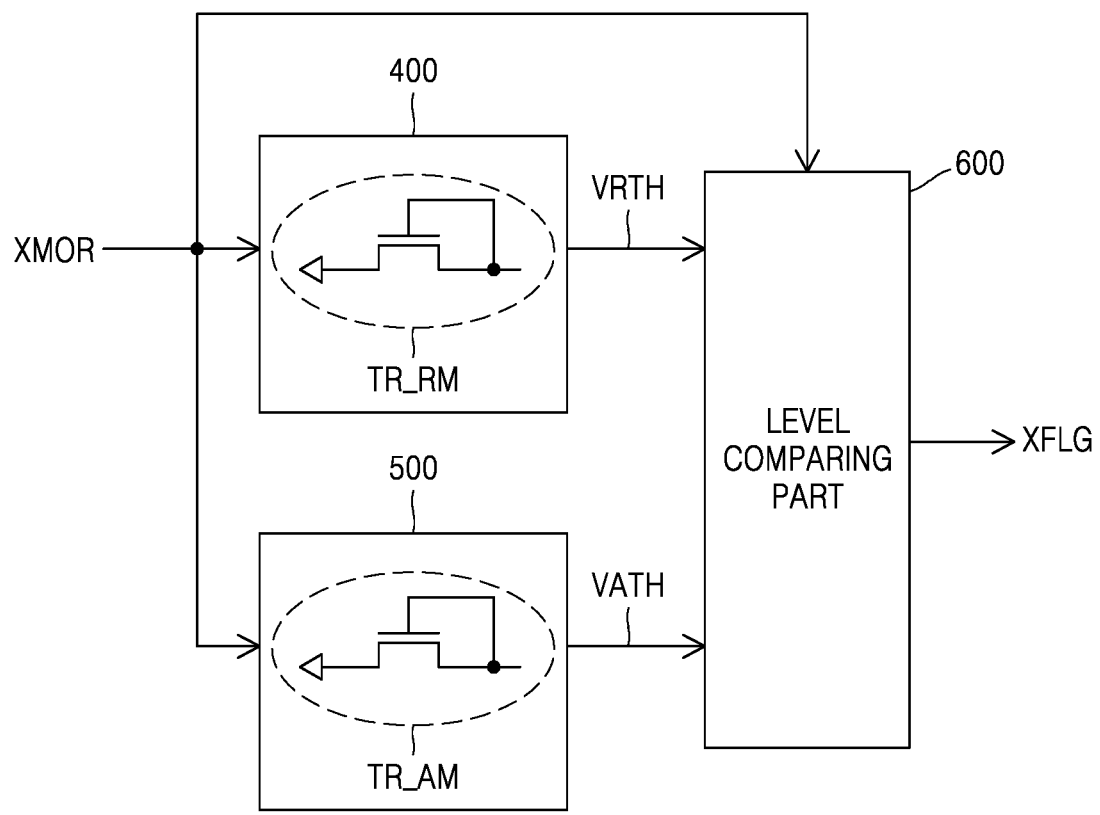
FIG. 7 is a schematic diagram showing an aging monitoring circuit of a semiconductor memory device according to an embodiment of the disclosure.

FIG. 7 is a schematic diagram showing an aging monitoring circuit of a semiconductor memory device according to an embodiment of the disclosure. Referring to FIG. 7, according to an embodiment, the aging monitoring circuit may include a reference threshold voltage generating part 400, an aging threshold voltage generating part 500, and a level comparing part 600.

The reference threshold voltage generating part 400 may include a reference monitoring transistor TR_RM. The reference threshold voltage generating part 400 may generate a reference threshold voltage VRTH in case that the aging monitoring signal XMOR is activated to "H".

The aging threshold voltage generating part 500 may include an aging monitoring transistor TR_AM. The aging threshold voltage generating part 500 may generate an aging threshold voltage VATH in case that the aging monitoring signal XMOR is activated to "H".

Figure 8:
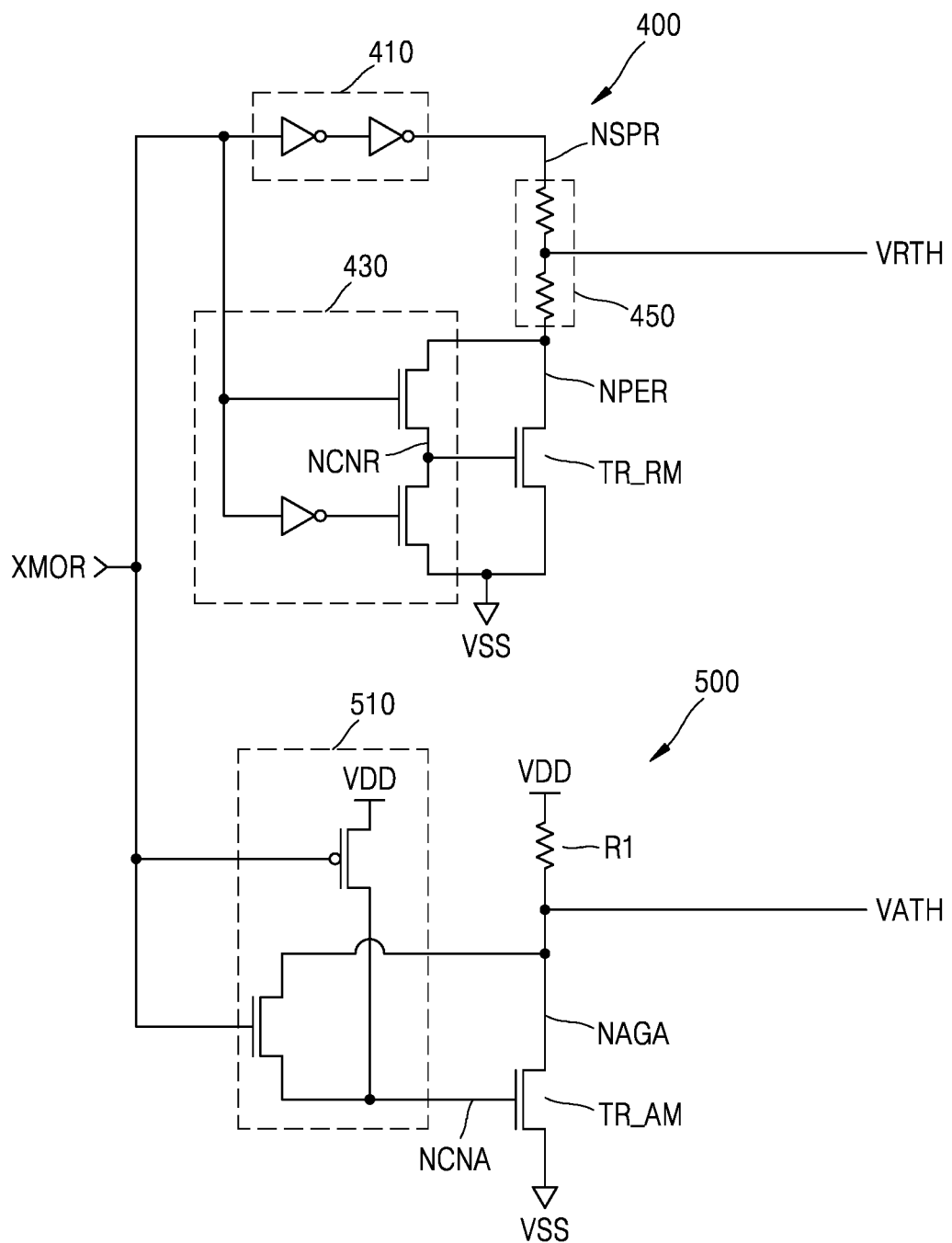
FIG. 8 is a schematic diagram showing the reference threshold voltage generating part and the aging threshold voltage generating part of FIG.

FIG. 8 is a schematic diagram showing the reference threshold voltage generating part 400 and the aging threshold voltage generating part 500 of FIG. 7.

Referring to FIG. 8, the reference threshold voltage generating part 400 may include the reference monitoring transistor TR_RM, a buffering part 410, a reference controller 430, and a voltage dividing part 450.

The reference monitoring transistor TR_RM may be formed between a reference preliminary node NPER and a ground voltage VSS. The reference monitoring transistor TR_RM may be a NMOS transistor which has a gate node electrically connected to a reference control node NCNR.

The buffering part 410 may buffer the aging monitoring signal XMOR to drive a reference supply node NSPR. Accordingly, the reference supply node NSPR may be controlled to a power supply voltage VDD in case that the aging monitoring signal XMOR is activated to "H". The reference supply node NSPR may be controlled to the ground voltage VSS in case that the aging monitoring signal is inactivated to "L".

The reference controller 430 may control the reference control node NCNR to the ground voltage VSS in case that the aging monitoring signal XMOR is inactivated to "L". Accordingly, the gate node of the reference monitoring transistor TR_RM may be controlled to the ground voltage VSS, so that no stress is applied in case that the aging monitoring signal XMOR is inactivated to "L".

The reference controller 430 may electrically connect the reference control node NCNR to the reference preliminary node NPER in case that the aging monitoring signal XMOR is activated to "H". Accordingly, the gate node of the reference monitoring transistor TR_RM and the reference preliminary node NPER may be electrically connected, and the reference monitoring transistor TR_RM may act as a diode.

Therefore, the reference preliminary node NPER may be at a level corresponding to the threshold voltage of the reference monitoring transistor TR_RM.

The voltage dividing part 450 may divide the voltage level between the reference supply node NSPR and reference preliminary node NPER to generate the reference threshold voltage VRTH.

Due to the reference threshold voltage generating part 400 as described above, the reference monitoring transistor TR_RM may be not stressed in case that the aging monitoring signal XMOR is deactivated to "L", and the reference threshold voltage VRTH may depend on the threshold voltage of the reference monitoring transistor TR_RM.

The aging threshold voltage generating part 500 may include an aging generating node NAGA, the aging monitoring transistor TR_AM, and an aging controller 510.

The aging generating node NAGA may provide the aging threshold voltage VATH. The resistor R1 may prevent the aging generating node NAGA from floating.

The aging monitoring transistor TR_AM may be formed between the aging generating node NAGA and a ground voltage VSS. The aging monitoring transistor TR_AM may have a gate node which is electrically connected to an aging control node NCNA.

The aging controller 510 may control the aging control node NCNA to the power supply voltage VDD in case that the aging monitoring signal XMOR is inactivated to "L". Accordingly, the gate node of the aging monitoring transistor TR_AM may be controlled to the power supply voltage VDD. Therefore, the gate node of the aging monitoring transistor TR_AM may receive stress, even in case that the aging monitoring signal XMOR is inactivated to "L".

The aging controller 510 may electrically connect the aging control node NCNA to the aging generating node NAGA in case that the aging monitoring signal XMOR is activated to "H". Accordingly, the gate node of the aging monitoring transistor TR_AM may be electrically connected to the aging generating node NAGA, and the aging monitoring transistor TR_AM may act as a diode. Therefore, the level of the aging generating node NAGA, for example, the aging threshold voltage VATH may become a level corresponding to the threshold voltage of the aging monitoring transistor TR_AM.

Due to the aging threshold voltage generating part 500 described above, the aging monitoring transistor TR_AM may be stressed even in case that the aging monitoring signal XMOR is deactivated to "L", and the aging threshold voltage VATH may depend on the threshold voltage of the aging monitoring transistor TR_AM.

According to an embodiment, in a state in which stress is not applied, for example, at the beginning of use of the semiconductor memory device employing the aging monitoring circuit, the level of the reference threshold voltage VRTH may be higher than the level of the aging threshold voltage VATH.

Referring back to FIG. 7, the level comparing part 600 may be enabled in response to the activation "H" of the aging monitoring signal XMOR and may generate an aging flag signal XFLG.

Figure 9:
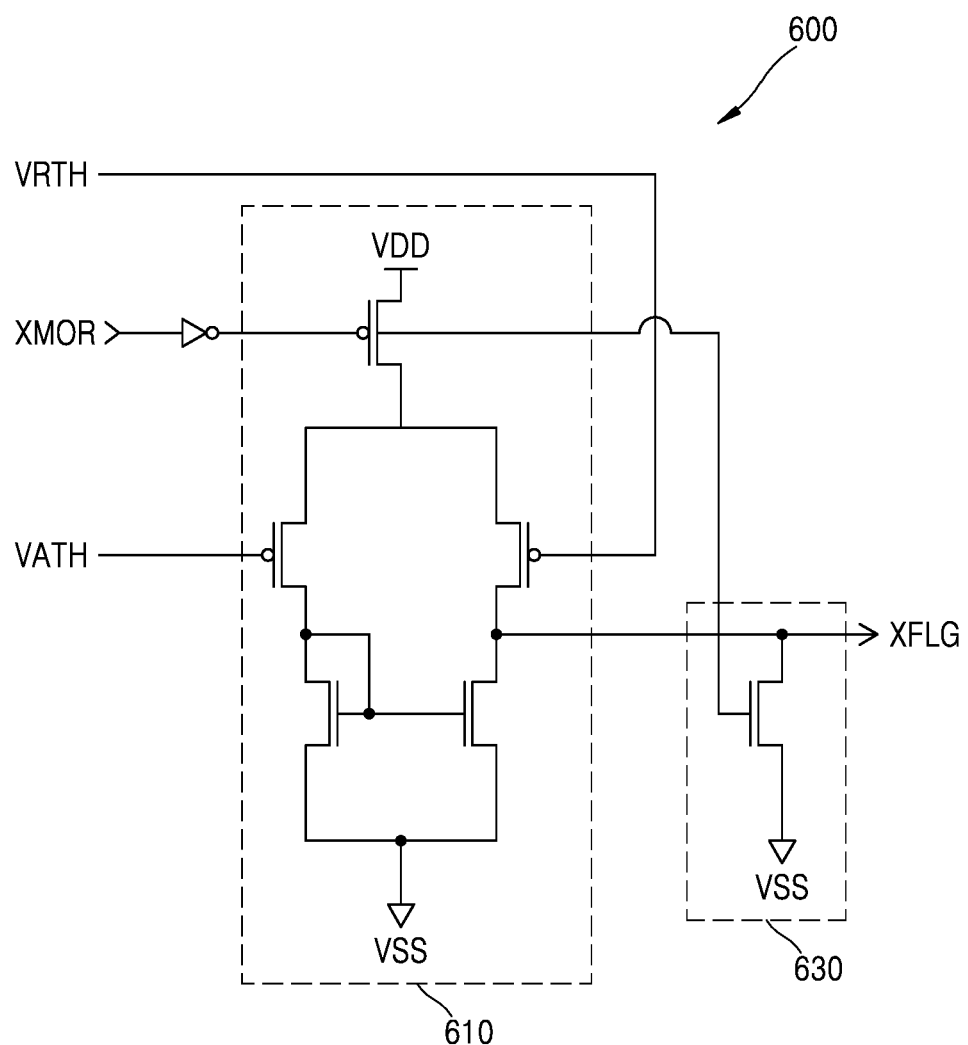
FIG. 9 is a schematic diagram showing the level comparing part of FIG. 7.

FIG. 9 is a schematic diagram showing the level comparing part 600 of FIG. 7. Referring to FIG. 9, the level comparing part 600 may include a comparison part 610 and a flag controller 630.

The comparison part 610 may be enabled in response to the activation "H" of the aging monitoring signal XMOR. The comparison part 610 may generate the aging flag signal XFLG by comparing the level of the aging threshold voltage VATH with the level of the reference threshold voltage VRTH.

The aging flag signal XFLG may be activated to "H" in case that the level of the aging threshold voltage VATH is higher than the level of the reference threshold voltage VRTH.

The flag controller 630 may control the aging flag signal XFLG to be in an inactive state of "L" in response to the inactivation "L" of the aging monitoring signal XMOR.

According to the level comparing part 600, the logic state of the aging flag signal XFLG may depend on the comparison result between the level of the aging threshold voltage VATH generated from the aging threshold voltage generating part 500 and the reference threshold voltage VRTH.

For example, in case that the level of the aging threshold voltage VATH is lower than the level of the reference threshold voltage VRTH, the aging flag signal XFLG may maintain an inactive state at "L".

In case that aging progresses and the level of the aging threshold voltage VATH becomes higher than the level of the reference threshold voltage VRTH, the aging flag signal XFLG may be activated to "H".

For example, it may be determined by the logic state of the aging flag signal XFLG of the degree of aging of the transistor included in the bit line sense amplifier BLSA. According to an embodiment, a large number of bit line sense amplifiers BLSAs may be embedded in the semiconductor memory device employing the aging monitoring circuit.

In conclusion, according to an embodiment of the aging monitoring circuit having the above configuration, aging of the semiconductor memory device may be effectively monitored using the change in the threshold voltage of the transistor.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An aging monitoring circuit of a semiconductor memory device comprising:
   a threshold voltage sensing part including an aging monitoring transistor, enabled in response to activation of an aging monitoring signal, and generating a sensing threshold signal, a level of the sensing threshold signal depending on a threshold voltage of the aging monitoring transistor;
   a reference threshold storage part receiving the sensing threshold signal generated in response to activation of a reference sensing signal and storing a reference threshold voltage, a level of the reference threshold voltage depending on the level of the sensing threshold signal; and
   a level comparing part enabled in response to the activation of the aging monitoring signal and generating an aging flag signal, a logic state of the aging flag signal depending on a comparison result between the level of the sensing threshold signal and the level of the reference threshold voltage.

2. The aging monitoring circuit of claim 1, wherein the threshold voltage sensing part further includes:
   a pull-up node;
   a pull-down node;
   a sensing node;
   a control signal generating part electrically connecting the pull-up node to a power supply voltage, electrically connecting the pull-down node to a ground voltage, and electrically connecting the sensing node to a bit line reference voltage in a normal operating period, and disconnecting electrical connection between the pull-up node and the power supply voltage, electrically connecting the pull-down node and the ground voltage, and disconnecting electrical connection between the sensing node and the bit line reference voltage in an aging monitoring period, the aging monitoring signal being inactive in the normal operating period, and active in the aging monitoring period; and at least one bit line sense amplifier, each formed in parallel between the pull-up node and the pull-down node, having the aging monitoring transistor, amplifying a voltage difference between a bit line pair using at least a part of the aging monitoring transistor in the normal operation period, and providing a voltage corresponding to the threshold voltage of the aging monitoring transistor to the sensing node in the aging monitoring period, wherein the level of the sensing threshold signal depends on a level of the sensing node.

3. The aging monitoring circuit of claim 2, wherein the control signal generating part includes:

a pull-up supply switch electrically connecting the pull-up node to the power supply voltage in response to activation of a pull-up supply signal, the pull-up supply signal activated in the normal operating period and deactivated in the aging monitoring period;

a pull-down supply switch electrically connecting the pull-down node to the ground voltage in response to activation of a pull-down supply signal, the pull-down supply signal activated in the normal operating period and the aging monitoring period; and a reference supply switch electrically connecting the sensing node to the bit line reference voltage in response to deactivation of the aging monitoring signal.

4. The aging monitoring circuit of claim 2, wherein the control signal generating part further includes:

a node equalization part electrically connecting the pull-up node and the pull-down node to the bit line reference voltage in response to a standby signal activated in a standby period, wherein the standby period is different from the normal operating period and the aging monitoring period.

5. The aging monitoring circuit of claim 2, wherein
the bit line pair includes an intrinsic bit line and a complementary bit line, and
the at least one bit line sense amplifier includes:
a pull-up driving part electrically connected to the pull-up node and increasing a voltage level of one having higher level between the intrinsic bit line and the complementary bit line in the normal operating period;
a pull-down driving part decreasing a voltage level of one having lower level between the intrinsic bit line and the complementary bit line in the normal operating period and including a first pull-down transistor and a second pull-down transistor, the first pull-down transistor being an NMOS transistor formed between the pull-down node and the intrinsic bit line and having a gate node electrically connected to the complementary bit line, the second pull-down transistor being an NMOS transistor formed between the pull-down node and the complementary bit line and having a gate node electrically connected to the intrinsic bit line, and the aging monitoring transistor being one of the first pull-down transistor and the second pull-down transistor having lower threshold voltage; and a bit line equalization part electrically connecting the intrinsic bit line and the complementary bit line to the sensing node in response to activation of a bit line equalization signal.

6. The aging monitoring circuit of claim 1, wherein the threshold voltage sensing part further includes:

at least one bit line sense amplifier, each amplifying a voltage of a bit line pair using the aging monitoring transistor to generate a sensing voltage, wherein the level of the sensing threshold signal depends on a level of the sensing voltage.

7. The aging monitoring circuit of claim 1, wherein the reference threshold storage part includes:

a code converter enabled in response to the activation of the reference sensing signal and generating a threshold code, the threshold code having a value corresponding to the level of the sensing threshold signal;

a code storage part storing the threshold code and generating a storage code, the storage code having a value corresponding to the threshold code; and a voltage converter generating the reference threshold voltage, the level of the reference threshold voltage corresponding to the value of the storage code.

8. The aging monitoring circuit of claim 1, wherein the level of the reference threshold voltage is higher than the level of the sensing threshold signal with a margin voltage difference in case that the reference sensing signal is activated.

9. The aging monitoring circuit of claim 1, wherein the level comparing part includes:

a comparison part enabled in response to the activation of the aging monitoring signal and generating the aging flag signal by comparing the level of the sensing threshold signal with the level of the reference threshold voltage, the aging flag signal activated in response to the level of the sensing threshold signal being higher than the level of the reference threshold voltage; and a flag controller controlling the aging flag signal to be in an inactive state in response to inactivation of the aging monitoring signal.

* * * * *